United States Patent
Lee et al.

(10) Patent No.: US 11,271,573 B2
(45) Date of Patent: Mar. 8, 2022

(54) ELECTRONIC DEVICE INCLUDING PHASE LOCKED LOOP CIRCUIT USED FOR RADIO FREQUENCY COMMUNICATION

(71) Applicant: Samsung Electronics Co., Ltd., Gyeonggi-do (KR)

(72) Inventors: Youngmin Lee, Gyeonggi-do (KR); Woojin Kim, Gyeonggi-do (KR); Hyoseok Na, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/029,450

(22) Filed: Sep. 23, 2020

(65) Prior Publication Data

US 2021/0091773 A1 Mar. 25, 2021

(30) Foreign Application Priority Data

Sep. 23, 2019 (KR) .................. 10-2019-0117080

(51) Int. Cl.
*H03L 7/093* (2006.01)
*H03L 7/185* (2006.01)

(52) U.S. Cl.
CPC ............ *H03L 7/093* (2013.01); *H03L 7/185* (2013.01)

(58) Field of Classification Search
CPC ....... H03L 7/091; H03L 7/093; H03L 7/0814; H03L 7/0991; H03L 7/185
See application file for complete search history.

(56) References Cited

U.S. PATENT DOCUMENTS

| 7,508,898 | B2* | 3/2009 | Cyr ..................... H01L 24/06 |
| | | | 375/375 |
| 8,843,090 | B2* | 9/2014 | Boos .................... H04B 7/082 |
| | | | 455/131 |
| 2002/0084814 | A1 | 7/2002 | Yamawaki et al. |
| 2002/0145457 | A1 | 10/2002 | Sumi |
| 2004/0009753 | A1 | 1/2004 | Ogata |
| 2004/0048591 | A1 | 3/2004 | Kim et al. |
| 2006/0208778 | A1 | 9/2006 | Sowlati et al. |
| 2010/0310031 | A1 | 12/2010 | Ballantyne et al. |
| 2021/0083755 | A1* | 3/2021 | Kim ..................... H04B 17/10 |

FOREIGN PATENT DOCUMENTS

| JP | 4057791 | 3/2008 |
| KR | 10-0785003 | 12/2007 |
| KR | 20090027406 | 3/2009 |

OTHER PUBLICATIONS

International Search Report dated Dec. 21, 2020 issued in counterpart application No. PCT/KR2020/012718, 4 pages.

* cited by examiner

*Primary Examiner* — Hai L Nguyen
(74) *Attorney, Agent, or Firm* — The Farrell Law Firm, P.C.

(57) ABSTRACT

Disclosed is an electronic device that is configured to determine whether a phase locked loop (PLL) circuit is operating normally, thereby preventing component damage in the electronic device and preventing disconnection from a communication network.

20 Claims, 9 Drawing Sheets

ELECTRONIC DEVICE INCLUDING PHASE LOCKED LOOP CIRCUIT USED FOR RADIO FREQUENCY COMMUNICATION

CROSS-REFERENCE TO RELATED APPLICATION(S)

This application is based on and claims priority under 35 U.S.C. § 119 to Korean Patent Application No. 10-2019-0117080, filed on Sep. 23, 2019, in the Korean Intellectual Property Office, the disclosure of which is incorporated herein by reference in its entirety.

BACKGROUND

1. Field

The disclosure relates generally to an electronic device, and more particularly, to an electronic device including a phase locked loop (PLL) circuit in radio frequency (RF) communication.

2. Description of Related Art

An electronic device may transmit, through an antenna, an RF signal in a frequency band designated for use in cellular communication, such as 5th generation (5G) or legacy communication. A PLL circuit is capable of locking a frequency band of a reference signal used when converting a baseband signal into an RF signal, to a designated reference frequency band.

When the PLL circuit operates abnormally, a phenomenon in which the frequency band of the reference signal is not locked to the reference frequency band may occur. This may cause components of the electronic device to be damaged or cause the connection between the electronic device and the network to be dropped.

For example, due to the abnormal operation of the PLL circuit, an RF signal amplified by a power amplifier circuit may be reflected toward the power amplifier circuit without passing through a duplexer, thereby causing the power amplifier circuit to be damaged. As another example, even if the RF signal is radiated through an antenna, its frequency band may be different from a frequency band designated for use in the corresponding communication. Thus, connection for a communication service, such as a call service, tends to frequently drop.

The electronic device may acquire the power of the RF signal on a path connecting the duplexer and the antenna by using a feedback receiver (FBRX) and compare the acquired power with a reference value to determine whether the PLL circuit is normally operated. For example, the acquired power being higher than the reference value indicates a normal operation, whereas the acquired power being lower than the reference value indicates an abnormal operation.

However, this method tends to reflect incorrect operations. For example, if there is an error in the band pass characteristics of the duplexer, the power acquired through the FBRX may be higher than the reference value even though the frequency band of the RF signal is not locked to the reference frequency band. Therefore, it may be mistakenly recognized that the PLL circuit operates normally.

In addition, due to a phenomenon in which the impedance of the antenna is distorted, the acquired power may be lower than the reference value despite the normal operation of the PLL circuit. Therefore, it may be mistakenly recognized that the PLL circuit operates abnormally.

Moreover, the RF signal acquired by the FBRX may be converted into a baseband signal. The PLL circuit, which is a target for determining a normal or abnormal operation, may be used during the conversion. In this case, an error may occur in determining the normal or abnormal operation.

Therefore, there is a need in the art for a method and apparatus that obviate such incorrect operation determinations of PLL circuits.

SUMMARY

Aspects of the disclosure are to address at least the above-mentioned problems and/or disadvantages and to provide at least the advantages described below. Accordingly, an aspect of the disclosure is to provide an electronic device configured to determine whether a PLL circuit is operating normally, thereby preventing component damage in the electronic device.

Another aspect of the disclosure is to provide an electronic device configured to determine whether the PLL circuit is operating normally in order to prevent disconnection from the network.

In accordance with an aspect of the disclosure, an electronic device may include an antenna, a duplexer including a first band pass filter (BPF) configured to output a first radio frequency (RF) signal of a transmission frequency band designated to be used for data transmission to a network through the antenna, and a second BPF configured to output a second RF signal of a reception frequency band designated to be used for data reception from the network through the antenna, a power amplifier circuit configured to amplify the first RF signal and output the amplified signal to the first BPF, a processor, and a transceiver connected to the processor and the power amplifier circuit. The transceiver may include a first PLL circuit configured to output a first reference signal of a first reference frequency band, a first mixer configured to convert a first baseband signal received from the processor into the first RF signal by using the first reference signal, a detection circuit configured to detect the first RF signal on a path connecting the first mixer and the power amplifier circuit, a second PLL circuit configured to output a second reference signal of a second reference frequency band, a second mixer configured to, by using the second reference signal, convert the second RF signal received from the second BPF into a second baseband signal, and convert the first RF signal received from the detection circuit into a third baseband signal, a first filter configured to attenuate power of a frequency band higher than the second baseband in a signal to be transmitted from the second mixer to the processor, and a second filter configured to attenuate power of a frequency band lower than the third baseband or attenuate power of the third baseband in a signal to be transmitted from the second mixer to the processor.

In accordance with another aspect of the disclosure, an electronic device includes an antenna, a duplexer including a first BPF configured to output a first RF signal of a transmission frequency band designated to be used for data transmission to a network through the antenna, and a second BPF configured to output a second RF signal of a reception frequency band designated to be used for data reception from the network through the antenna, a power amplifier circuit configured to amplify the first RF signal and output the amplified signal to the first BPF, a processor, and a transceiver connected to the processor and the power amplifier circuit, wherein the transceiver includes a first PLL circuit configured to output a first reference signal of a first reference frequency band, a first mixer configured to convert a first baseband signal received from the processor into the first RF signal by using the first reference signal, a detection circuit configured to detect the first RF signal on a path connecting the first mixer and the power amplifier circuit, a second PLL circuit configured to output a second reference signal of a second reference frequency band, a second mixer configured to convert the second RF signal received from the second BPF into a second baseband signal by using the second reference signal, and output the second baseband signal to the processor, a third PLL circuit configured to output a third reference signal of a same frequency band as the first reference frequency band, a third mixer configured to convert the first RF signal received from the detection circuit into the first baseband signal by using the third reference signal, and a filter configured to attenuate power of a frequency band higher than the first baseband in a signal to be transmitted from the third mixer to the processor.

In accordance with another aspect of the disclosure, an electronic device includes an antenna, a duplexer including a first BPF configured to output a first RF signal of a transmission frequency band designated to be used for data transmission to a network through the antenna, and a second BPF configured to output a second RF signal of a reception frequency band designated to be used for data reception from the network through the antenna, a power amplifier circuit configured to amplify the first RF signal and output the amplified signal to the first BPF, a processor, and a transceiver connected to the processor and the power amplifier circuit, wherein the transceiver is configured to convert a first baseband signal received from the processor into the first RF signal and output the first RF signal to the power amplifier circuit, convert the second RF signal received from the second BPF into a second baseband signal and output the second baseband signal to the processor, acquire the first RF signal to be outputted to the power amplifier circuit, generate, by using the acquired first RF signal, a status signal indicating whether a frequency band of a reference signal used when converting the first baseband signal into the first RF signal is locked to a designated reference frequency band, and output the status signal to the processor.

BRIEF DESCRIPTION OF THE DRAWINGS

The above and other aspects, features and advantages of certain embodiments of the disclosure will be more apparent from the following detailed description, taken in conjunction with the accompanying drawings, in which.

DETAILED DESCRIPTION

Figure 1:
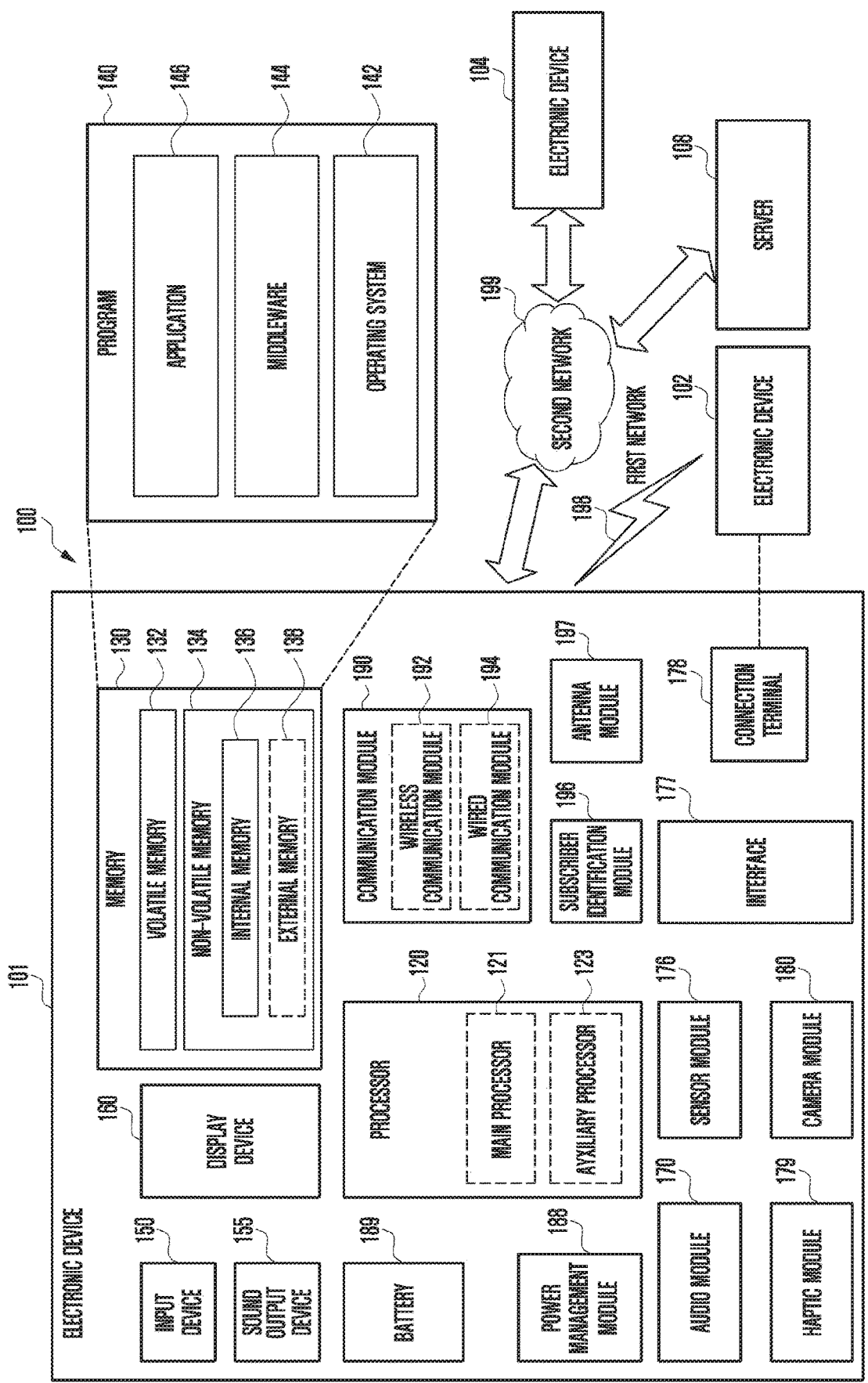
FIG. 1 is a block diagram illustrating an electronic device in a network environment according to an embodiment.

Hereinafter, embodiments of the disclosure will be described in detail with reference to the accompanying drawings. In the disclosure, embodiments are described in the drawings and a related detailed description is set forth, but this is not intended to limit the embodiments of the disclosure. Descriptions of well-known functions and constructions are omitted for the sake of clarity and conciseness.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include software (e.g., the program 140) and input data or output data for a command related thereto. The memory 130 may include the volatile memory 132 or the non-volatile memory 134.

The program 140 may be stored in the memory 130 as software, and may include an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include a microphone, a mouse, a keyboard, or a digital pen (e.g., a stylus pen).

The sound output device 155 may output sound signals to the outside of the electronic device 101. The sound output device 155 may include a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of a power management integrated circuit (PMIC).

The battery 189 may supply power to at least one component of the electronic device 101. According to an embodiment, the battery 189 may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor(e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
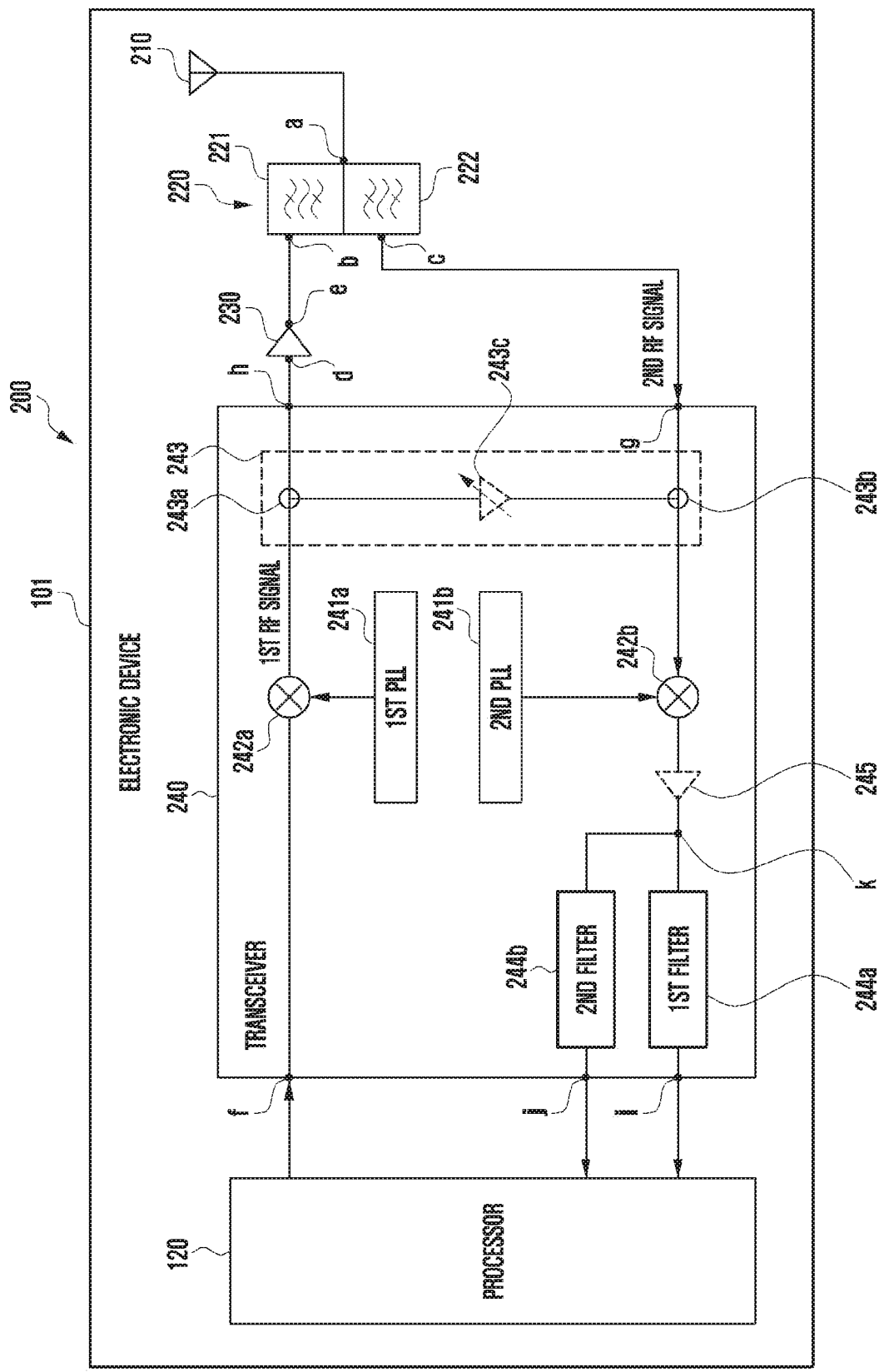
FIG. 2 is a block diagram illustrating an electronic device, configured to recognize the status of a PLL circuit when performing an operation of transmitting a transmission state of an RF signal, according to an embodiment.

FIG. 2 is a block diagram 200 illustrating an electronic device 101, configured to recognize a status of a PLL circuit when performing an operation of transmitting a transmission state of an RF signal, according to an embodiment.

Referring to FIG. 2, the electronic device 101 may include an antenna 210, a duplexer 220, a power amplifier circuit 230, a transceiver 240, and/or a processor 120. The antenna 210 may be an element constituting the antenna module 197 shown in FIG. 1. The transceiver 240 may be a wireless communication circuit that supports communication with a cellular network constituting the wireless communication module 192 shown in FIG. 1.

The duplexer 220 may include a first BPF 221 that outputs an RF signal of a frequency band (f_tx) designated to be used for data transmission to a network, a second BPF 222 that outputs an RF signal of a frequency band (f_rx) designated to be used for data reception from a network, a first port (a) formed between the first BPF 221 and the second BPF 222 and connected to the antenna 210, a second port (b) connected to the first BPF 221, and/or a third port (c) connected to the second BPF 222.

The first BPF 221 may be configured to pass only an RF signal having the transmission frequency band (f_tx) in a signal received through the second port (b) and output the passed signal to the first port (a). The second BPF 222 may be configured to pass only an RF signal having the reception frequency band (f_rx) in a signal received through the first port (a) and output the passed signal to the third port (c).

The transmission frequency band (f_tx) may include an uplink band in a selected one of frequency bands designated to be used for a frequency division duplexing (FDD) communication scheme in a 5G or legacy network defined in 3GPP. The reception frequency band (f_rx) may include a downlink band in the selected frequency band. The uplink band may be either lower or higher than the downlink band. The legacy network may refer to 2G, 3G, 4G, and/or long term evolution (LTE) network(s).

The first BPF 221 may include a surface acoustic wave (SAW) filter configured to output an RF signal of the transmission frequency band (f_tx). The second BPF 222 may include a SAW filter configured to output an RF signal of the reception frequency band (f_rx).

The power amplifier circuit 230 may be disposed on a path connecting the first BPF 221 and the transceiver 240 and may include an input port (d) configured to be connected to the transceiver 240, and an output port (e) configured to be connected to the second port (b) of the duplexer 220. The power amplifier circuit 230 may receive an RF signal from the transceiver 240 through the input port (d), amplify the received RF signal, and output the amplified RF signal to the duplexer 220 through the output port (e).

The transceiver 240 may include a first input port (f) connected to the processor 120, a second input port (g) connected to the third port (c) of the duplexer 220, a first output port (h) connected to the input port (d) of the power amplifier circuit 230, a second output port (i) connected to the processor 120, and/or a third output port (j) connected to the processor 120. The transceiver 240 may receive, from the processor 120 through the first input port (f), a signal of a first baseband (e.g., about 0 to several tens of megahertz (MHz)) including data to be transmitted to the network. The transceiver 240 may convert the first baseband signal into a first RF signal of the transmission frequency band (f_tx) and then output the first RF signal to the power amplifier circuit 230 through the first output port (h). The transceiver 240 may receive, from the second BPF 222 of the duplexer 220 through the second input port (g), a second RF signal of the reception frequency band (f_rx) including data to be transmitted to the processor 120. The transceiver 240 may convert the second RF signal into a signal of a second baseband, identical to the first baseband, and then output the second baseband signal to the processor 120 through the second output port (i).

The transceiver 240 may acquire the first RF signal to be outputted to the power amplifier circuit 230 through the first output port (h) and, using the acquired first RF signal, generate a status signal indicating whether a frequency band of a reference signal used when converting the first baseband signal into the first RF signal is locked to a designated reference frequency band. Then, the transceiver 240 may output the status signal to the processor 120 through the third output port (j).

The transceiver 240 may include a first PLL circuit 241a, a second PLL circuit 241b, a first mixer 242a, a second mixer 242b, a detection circuit 243, a first filter 244a, and/or a second filter 244b.

The first PLL circuit 241a may output a first reference signal (e.g., a first local oscillator (LO) signal) of a designated first reference frequency band (f_r1) to the first mixer 242a. The first mixer 242a may convert the first baseband signal into the first RF signal by mixing the first reference signal with the first baseband signal received from the first input port (f). For example, when the frequency of the first baseband signal is 0 Hz, the first reference frequency band (f_r1) of the first reference signal may be the transmission frequency band (f_tx). The first mixer 242a may output the first RF signal to the first output port (h).

The second PLL circuit 241b may output a second reference signal (e.g., a second LO signal) of a designated second reference frequency band (f_r2) to the second mixer 242b. The second mixer 242b may convert the second RF signal into the second baseband signal by mixing the second reference signal (e.g., a signal of the reception frequency band (f_rx)) with the second RF signal received from the second input port (g). By mixing the second reference signal with the first RF signal received from the detection circuit 243, the second mixer 242b may generate a signal of the third baseband (f_gap) corresponding to a gap between the transmission frequency band (f_tx) and the second reference frequency band(f_rx)(e.g., f_rx).

The detection circuit 243 may include an RF signal acquisition circuit 243a and an RF signal output circuit 243b. The RF signal acquisition circuit 243a may be disposed on a path connecting the first output port (h) and the first mixer 242a. The RF signal output circuit 243b may be disposed on a path connecting the second input port (g) and the second mixer 242b.

The RF signal acquisition circuit 243a may be configured to acquire the first RF signal outputted from the first mixer 242a to the first output port (h). For example, the RF signal acquisition circuit 243a may include a coupler or divider that is coupled to a path connecting the first output port (h) and the first mixer 242a and acquires a sampling the power of the first RF signal. As another example, the RF signal acquisition circuit 243a may include a first switch that has a first terminal connected to the first output port (h) and a second terminal connected to the RF signal output circuit 243b and is configured to selectively connect the first mixer 242a to the first terminal or the second terminal. Controlling the first switch may be performed by the processor 120.

The RF signal output circuit 243b may be configured to output the first RF signal, received from the RF signal acquisition circuit 243a, to the second mixer 242b. For example, the RF signal output circuit 243b may include a combiner configured to combine the first RF signal with the second RF signal received from the second input port (g) and output the combined signal to the second mixer 242b. As another example, the RF signal output circuit 243b may include a second switch that has a first terminal connected to the RF signal acquisition circuit 243a and a second terminal connected to the second input port (g) and is configured to selectively connect the second mixer 242b to the first terminal or the second terminal. Controlling the second switch may be performed by the processor 120.

The detection circuit 243 may further include an adjustment circuit 243c (e.g., a variable attenuator or a variable gain amplifier) disposed on a path connecting the RF signal acquisition circuit 243a and the RF signal output circuit 243b and configured to adjust (e.g., attenuate or amplify) the power of the first RF signal to converge to a specified level.

The first filter 244a may be disposed on a path connecting the second mixer 242b and the second output port (i), and configured to pass only a signal of a designated frequency band (e.g., the second baseband) in a signal received from the second mixer 242b and then output the passed signal to the second output port (i). For example, the first filter 244a may include a low pass filter (LPF) (e.g., a biquad filter (BQ)) configured to attenuate power in a frequency band higher than the second baseband in the signal received from the second mixer 242b.

The second filter 244b may include an HPF that is disposed on a path connecting the second mixer 242b and the third output port (j), and configured to attenuate power in a frequency band lower than the third baseband (f_gap) in the signal received from the second mixer 242b.

The second filter 244b may include a notch filter that is disposed on a path connecting the second mixer 242b and the third output port (j), and configured to attenuate power in the third baseband (f_gap) in the signal received from the second mixer 242b. The notch filter may be configured to change the frequency band to be attenuated, such as from band28 (B28) to B20, and thus a gap between the uplink band and the third baseband (f_gap) may also be changed. The notch filter may be configured to adjust the frequency band in which power is attenuated in accordance with the change of the third baseband (f_gap).

When the second mixer 242b is implemented with a passive mixer (e.g., a diode), output power compared to input power may be reduced. In order to compensate for this reduction, a first amplification circuit 245 may be disposed on a path connecting the second mixer 242b and a branch point (k) between the first and second filters 244a. The first amplification circuit 245 is a device for amplifying a voltage of an input signal (or converting a current of the input signal into a voltage) and may include a transimpedance amplifier (TIA).

Figure 3:
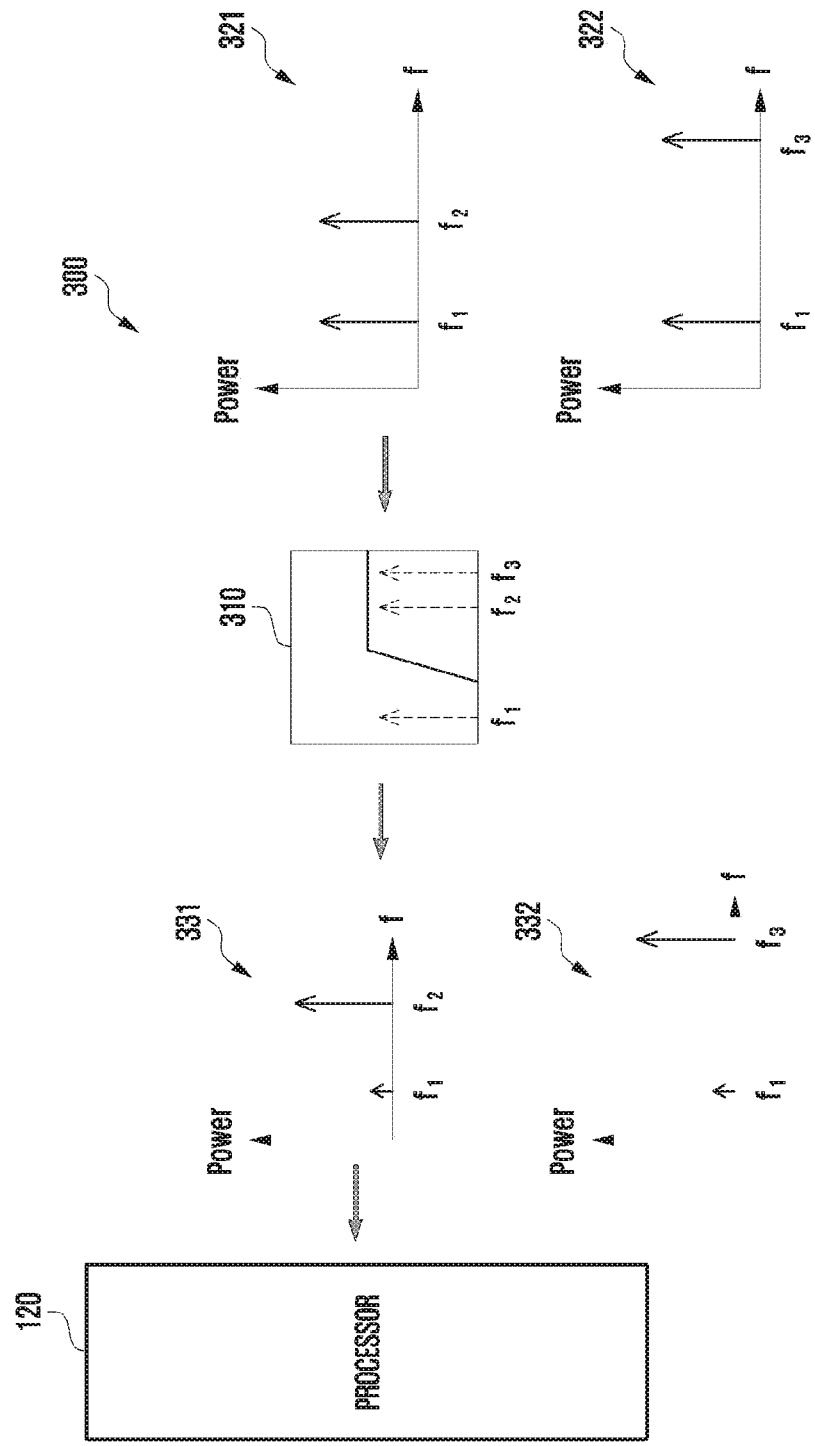
FIG. 3 illustrates the operation of a processor when the second filter of FIG. 2 is implemented as a high pass filter (HPF), according to an embodiment.

FIG. 3 illustrates the operation 300 of the processor 120 when the second filter 244b of FIG. 2 is implemented as an HPF, according to an embodiment In FIG. 3, the HPF 310 may receive a first signal 321 including a first frequency band (f1) (e.g., 0 Hz as the second baseband) and a second frequency band (f2) (e.g., the third baseband (f_gap)). The HPF 310 may attenuate the power of the first frequency band (f1) in the first signal 321 to convert the first signal 321 into a first status signal 331 indicating whether the frequency band of the first reference signal outputted from the first PLL circuit 241a is locked to the first reference frequency band. Then, the HPF 310 may output the first status signal 331 to the processor 120. The processor 120 may process the first status signal 331 and thereby recognize that the power of the second frequency band (f2) is greater than or equal to a specified level. The processor 120 may determine whether the second frequency band (f2) is a first reference value corresponding to the third baseband (f_gap) stored in a memory. Based on the determination that the second frequency band (f2) is consistent with (i.e., is equal to) the first reference value, the processor 120 may determine that the frequency band of the first reference signal outputted from the first PLL circuit 241a is locked to the first reference frequency band (e.g., f_tx).

The HPF 310 may receive a second signal 322 including the first frequency band (f1) and a third frequency band (f3). The HPF 310 may attenuate the power of the first frequency band (f1) in the second signal 322 to convert the second signal 322 into a second status signal 332 and output the second status signal 332 to the processor 120. The processor 120 may process the second status signal 332 and thereby recognize that the power of the third frequency band (f3) is greater than or equal to a specified level. The processor 120 may determine whether the third frequency band (f3) is the first reference value. Based on the determination that the third frequency band (f3) is not consistent with the first reference value, the processor 120 may determine that the frequency band of the first reference signal outputted from the first PLL circuit 241a is not locked to the first reference frequency band. Then, based on the determination that the first PLL circuit 241a is not locked, the processor 120 may perform a predetermined operation, such as deactivating or resetting an RFIC, for preventing component breakage (e.g., loss of the power amplifier circuit 230) or call disconnection.

Figure 4:
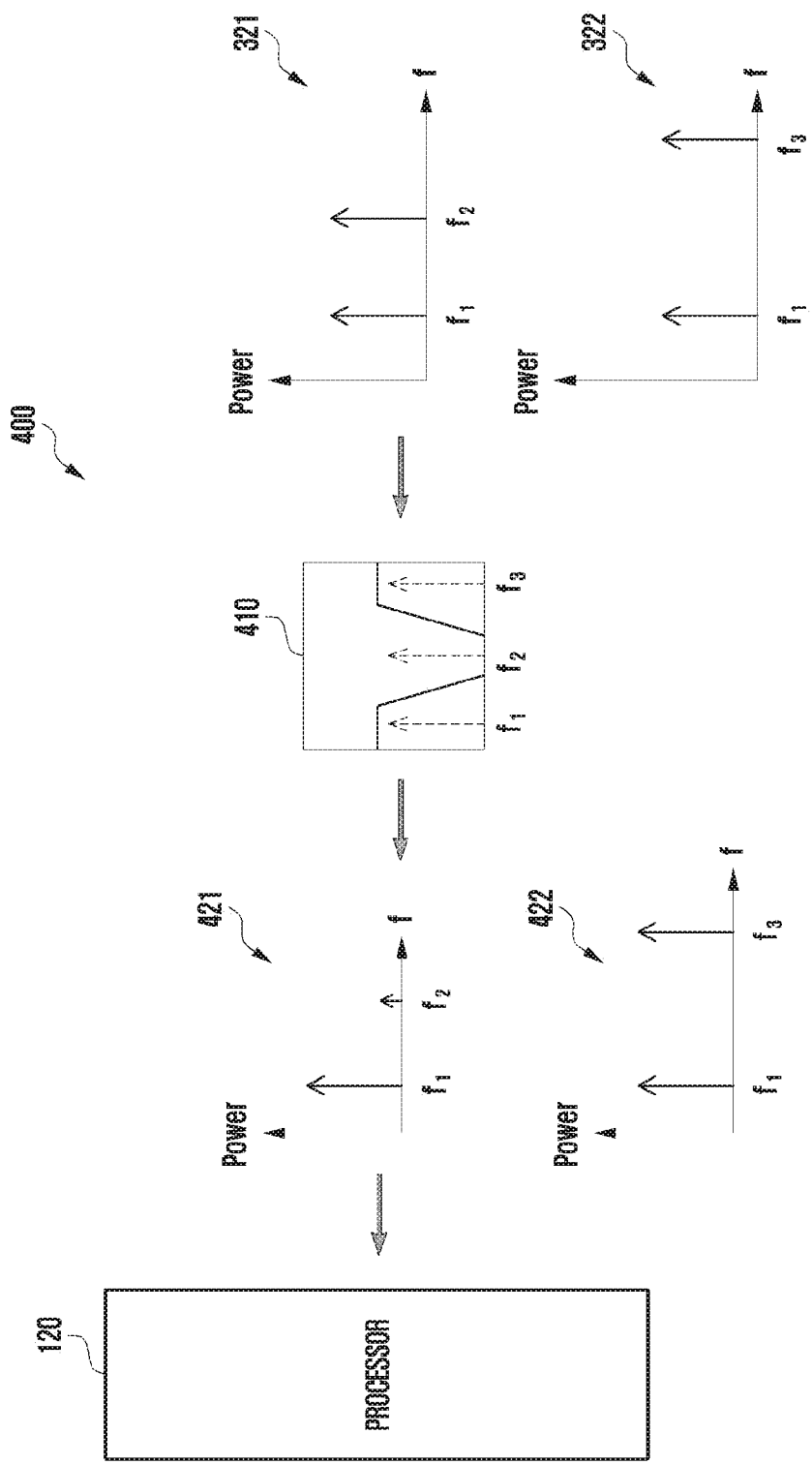
FIG. 4 illustrates the operation of a processor when the second filter of FIG. 2 is implemented as a notch filter, according to an embodiment.

FIG. 4 illustrates the operation 400 of the processor 120 when the second filter 244b of FIG. 2 is implemented as a notch filter, according to an embodiment.

In FIG. 4, the notch filter 410 may generate a third status signal 421 by attenuating the power of the second frequency band (f2) in the first signal 321 and output the third status signal 421 to the processor 120. The processor 120 may calculate the amount of power of the third status signal 421. The processor 120 may determine whether the calculated intensity is less than or equal to a second reference value stored in the memory. Then, based on the determination that the amount of power is less than or equal to the second reference value, the processor 120 may determine that the frequency band of the first reference signal outputted from the first PLL circuit 241a is locked to the first reference frequency band.

The notch filter 410 may output the second signal 322 as a fourth status signal 422 to the processor 120 without attenuation of power. The processor 120 may calculate the amount of power of the fourth status signal 422. Then, based on the determination that the amount of power of the fourth status signal 422 exceeds the second reference value, the processor 120 may determine that the frequency band of the first reference signal outputted from the first PLL circuit 241*a* is not locked to the first reference frequency band.

Figure 5:
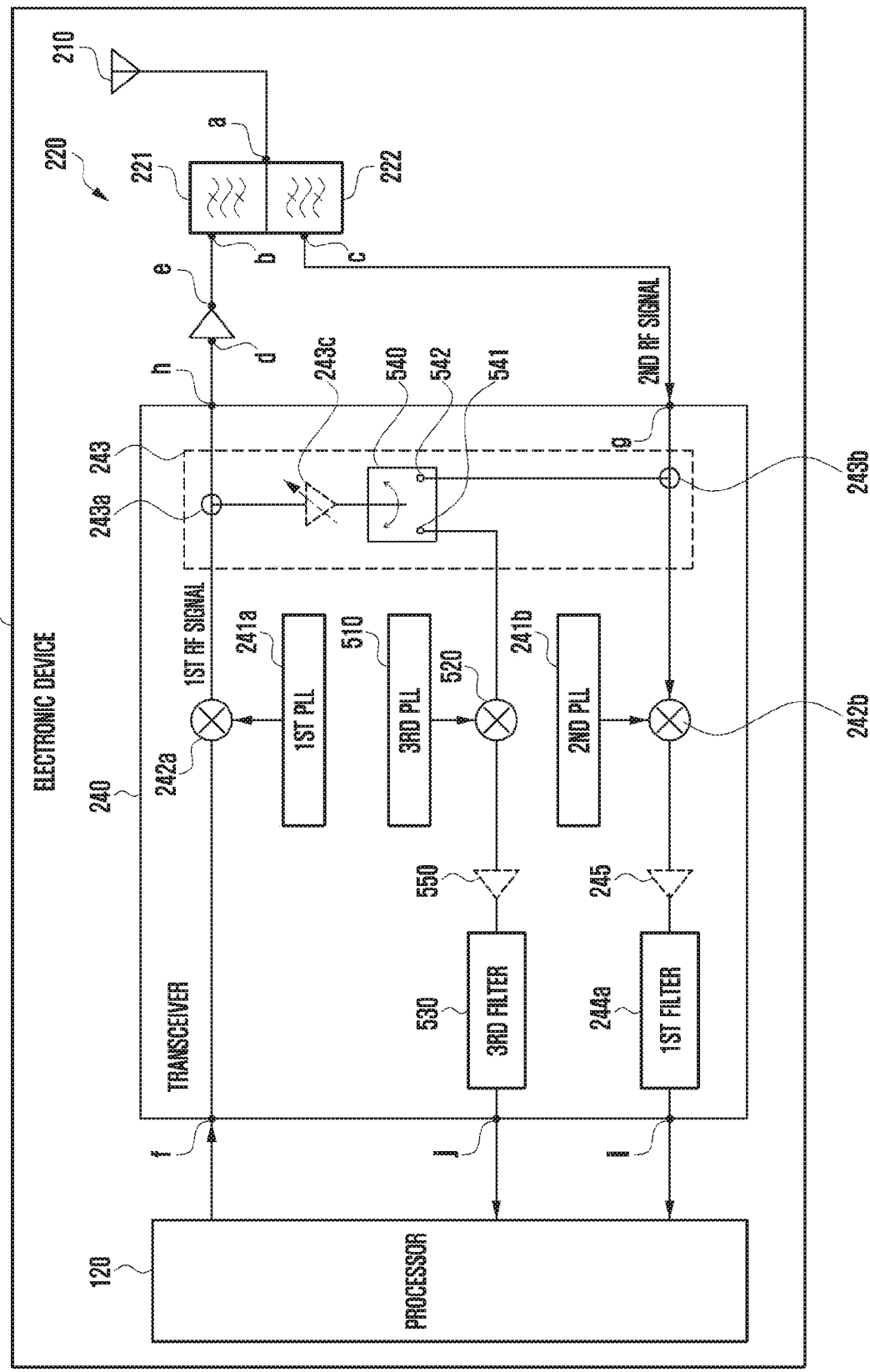
FIG. 5 is a block diagram illustrating an electronic device, configured to recognize a status of a PLL circuit when performing an operation of transmitting a transmission state of an RF signal, according to an embodiment.

FIG. 5 is a block diagram 500 illustrating an electronic device 101, configured to recognize a status of a PLL circuit when performing an operation of transmitting a transmission state of an RF signal, according to an embodiment. For conciseness, elements that are described in reference to FIG. 2 are omitted or only briefly described.

Referring to FIG. 5, the transceiver 240 may include the first PLL circuit 241*a*, the second PLL circuit 241*b*, the first mixer 242*a*, the second mixer 242*b*, the detection circuit 243, the first filter 244*a*, a third PLL circuit 510, a third mixer 520, and/or a third filter 530.

The third PLL circuit 510 may output, to the third mixer 520, a third reference signal of the same frequency band as the first reference frequency band (f_r1) of the first reference signal outputted from the first PLL circuit 241*a*. The third mixer 520 may output the first baseband signal corresponding to a gap between the transmission frequency band (f_tx) and the first reference frequency band (f_r1) by mixing the third reference signal with the first RF signal (f_tx) received from the detection circuit 243. The third filter 530 may include an LPF that is disposed on a path connecting the third mixer 520 and the third output port (j), and configured to attenuate power of a frequency band higher than the first baseband in a signal received from the third mixer 520.

The detection circuit 243 may further include a switch 540 disposed on a path connecting the RF signal acquisition circuit 243*a* (or the adjustment circuit 243*c*) and the RF signal output circuit 243*b*. The switch 540 may have a first terminal 541 connected to the third mixer 520 and a second terminal 542 connected to the RF signal output circuit 243*b*, and may selectively connect the RF signal acquisition circuit 243*a* and the adjustment circuit 243*c* to the first terminal 541 or the second terminal 542. Controlling the switch 540 may be performed by the processor 120.

When the third mixer 520 is implemented with a passive mixer, a second amplification circuit 550 may be disposed on a path connecting the third mixer 520 and the third filter 530 and the first amplification circuit 245 may be disposed on a path connecting the second mixer 242*b* and the first filter 244*a*.

Figure 6:
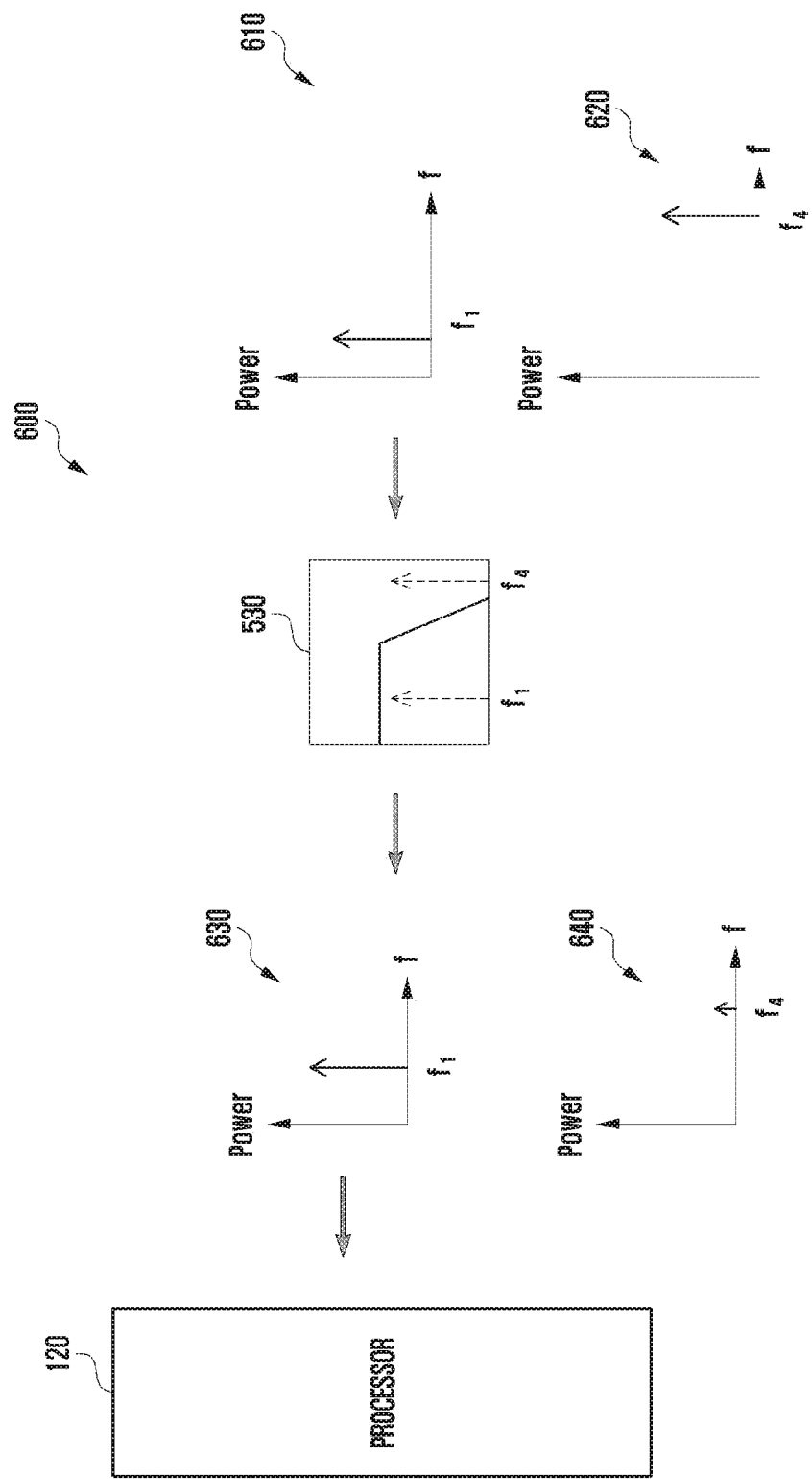
FIG. 6 illustrates the operation of a processor using a signal outputted from the third filter of FIG. 5.

FIG. 6 is a diagram 600 illustrating the operation of the processor 120 using a signal outputted from the third filter 530 of FIG. 5.

In FIG. 6, the third filter 530 may receive a third signal 610 (e.g., the first baseband signal) including the first frequency band (f1). The third filter 530 may output the third signal 610 as a fifth status signal 630 to the processor 120 without power attenuation. The processor 120 may calculate the amount of power of the fifth status signal 630. The processor 120 may determine whether the calculated intensity is greater than or equal to a third reference value stored in a memory. Then, based on the determination that the intensity is greater than or equal to the third reference value, the processor 120 may determine that the frequency band of the first reference signal outputted from the first PLL circuit 241*a* is locked to the first reference frequency band.

The third filter 530 may receive a fourth signal 620 including a fourth frequency band (f4). The third filter 530 may generate a sixth status signal 640 by attenuating the power of the fourth signal 620 and output the sixth status signal 640 to the processor 120. Then, based on the determination that the intensity of the sixth status signal 640 is less than the third reference value, the processor 120 may determine that the frequency band of the first reference signal outputted from the first PLL circuit 241*a* is not locked to the first reference frequency band.

Figure 7:
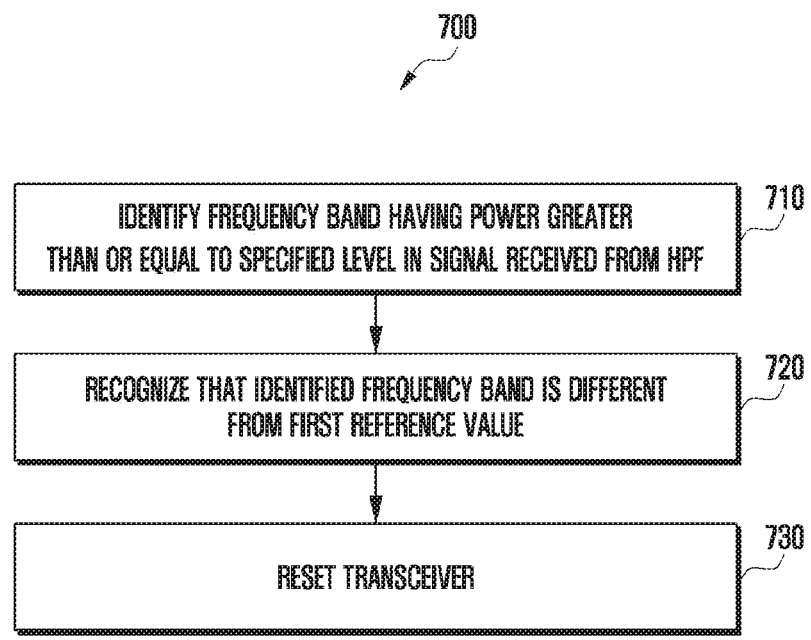
FIG. 7 illustrates operations of a processor according to a first embodiment.

FIG. 7 illustrates operations 700 of the processor 120 according to a first embodiment.

Referring to FIG. 7, in step 710, the processor 120 may identify a frequency band having power greater than or equal to a specified level in a signal received from the HPF through the third output port of the transceiver.

In step 720, the processor 120 may recognize that the identified frequency band is different from the first reference value.

In step 730, the processor may reset the transceiver in accordance with to the above recognition. For example, the processor may reset the frequency of a signal to be outputted from the first PLL circuit.

Figure 8:
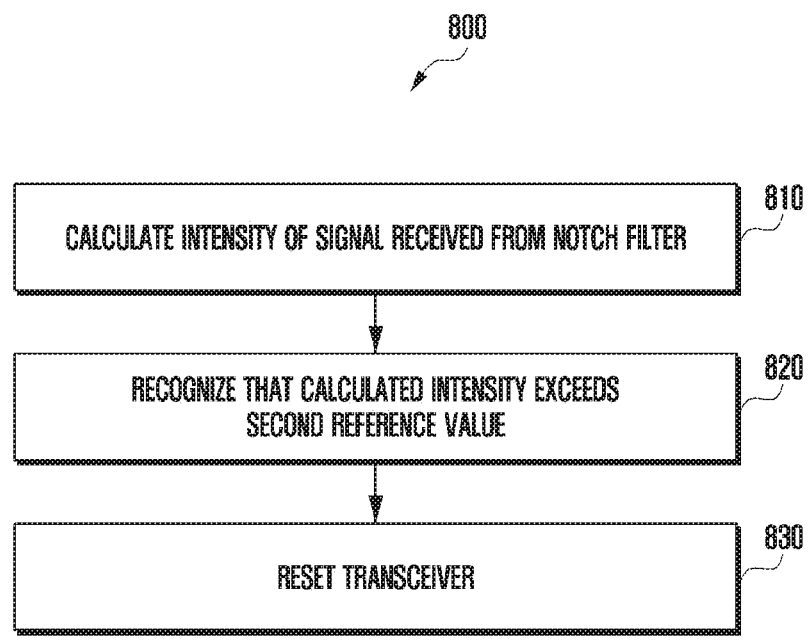
FIG. 8 illustrates operations of a processor according to a second embodiment.

FIG. 8 illustrates operations 800 of the processor 120 according to a second embodiment.

Referring to FIG. 8, in step 810, the processor may calculate the amount of power of a signal received from a notch filter through the third output port of the transceiver.

In step 820, the processor may recognize that the calculated intensity exceeds the second reference value.

In step 830, the processor may reset the transceiver 240 in accordance with the above recognition.

Figure 9:
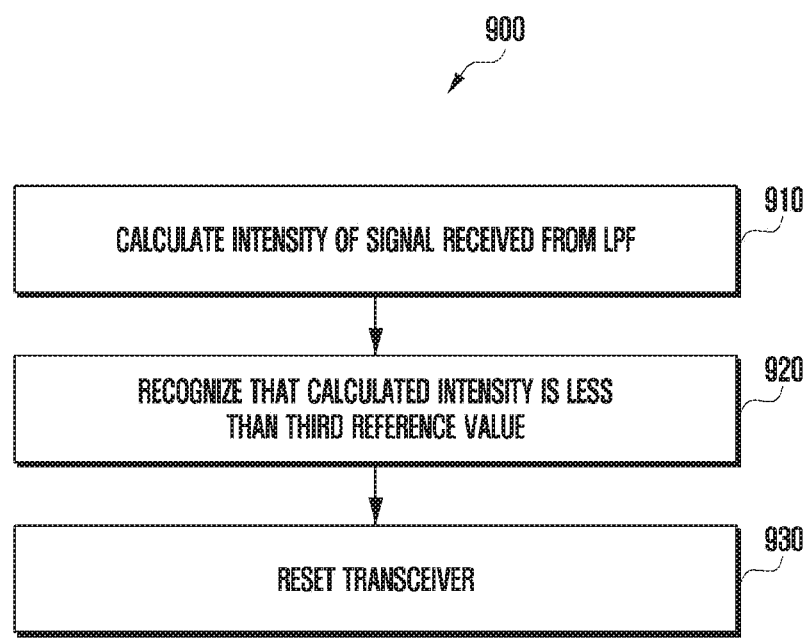
FIG. 9 illustrates operations of a processor according to a third embodiment.

FIG. 9 illustrates operations 900 of the processor 120 according to a third embodiment.

Referring to FIG. 9, in step 910, the processor may calculate the amount of power of a signal received from an LPF through the third output port of the transceiver.

In step 920, the processor may recognize that the calculated intensity is less than the third reference value.

In step 930, the processor may reset the transceiver 240 in accordance with the above recognition.

According to an embodiment, an electronic device may include an antenna, a duplexer including a first BPF outputting a first RF signal of a transmission frequency band designated to be used for data transmission to a network through the antenna, and a second BPF configured to output a second RF signal of a reception frequency band designated to be used for data reception from the network through the antenna, a power amplifier circuit configured to amplify the first RF signal and output the amplified signal to the first BPF, a processor, and a transceiver connected to the processor and the power amplifier circuit. The transceiver may include a first PLL circuit configured to output a first reference signal of a first reference frequency band, a first mixer configured to convert a first baseband signal received from the processor into the first RF signal by using the first reference signal, a detection circuit configured to detect the first RF signal on a path connecting the first mixer and the power amplifier circuit, a second PLL circuit configured to output a second reference signal of a second reference frequency band, a second mixer configured to, by using the second reference signal, convert the second RF signal received from the second BPF into a second baseband signal, and convert the first RF signal received from the detection circuit into a third baseband signal, a first filter configured to attenuate power of a frequency band higher than the second baseband in a signal to be transmitted from the second mixer to the processor, and a second filter configured to attenuate power of a frequency band lower than the third baseband or attenuate power of the third baseband in a signal to be transmitted from the second mixer to the processor.

The second filter may include a HPF configured to attenuate the power of the frequency band lower than the third baseband, and based on determination that a frequency band of a signal received from the second filter is not consistent with a first reference value corresponding to the third baseband, the processor may be configured to determine that a frequency band of the first reference signal outputted from the first PLL circuit is not locked to the first reference frequency band.

The second filter may include a notch filter configured to attenuate the power of the third baseband, and based on determination that intensity of a signal received from the second filter exceeds a second reference value, the processor may be configured to determine that a frequency band of the first reference signal outputted from the first PLL circuit is not locked to the first reference frequency band. The notch filter may be configured to adjust a frequency band to be attenuated in accordance with a change of a gap between the transmission frequency band and the reception frequency band.

The transmission frequency band may include an uplink band in a particular band selected from frequency bands designated to be used for an FDD communication scheme, and the reception frequency band may include a downlink band in the particular frequency band. The first reference frequency band and the second reference frequency band may be the uplink band and the downlink band, respectively, and the third baseband may correspond to a gap between the uplink band and the downlink band.

The detection circuit may include an RF signal acquisition circuit disposed on a path connecting the first mixer and the power amplifier circuit and configured to acquire the first RF signal, and an RF signal output circuit disposed on a path connecting the second BPF and the second mixer and configured to output the acquired first RF signal to the second mixer.

The RF signal acquisition circuit may include a coupler, a divider, or a first switch configured to selectively connect the first mixer to the power amplifier circuit or the RF signal output circuit. The RF signal output circuit may include a combiner, or a second switch configured to selectively connect the second mixer to the RF signal acquisition circuit or the second BPF.

The detection circuit may further include an adjustment circuit disposed on a path connecting the RF signal acquisition circuit and the RF signal output circuit, and configured to adjust power of the first RF signal, acquired by the RF signal acquisition circuit, to converge to a specified level.

The second mixer may be implemented with a passive mixer, and the transceiver may further include an amplification circuit configured to amplify a voltage of a signal outputted from the second mixer and output the voltage-amplified signal to the first filter and the second filter.

According to an embodiment, an electronic device may include an antenna, a duplexer including a first BPF configured to output a first RF signal of a transmission frequency band designated to be used for data transmission to a network through the antenna, and a second BPF configured to output a second RF signal of a reception frequency band designated to be used for data reception from the network through the antenna, a power amplifier circuit configured to amplify the first RF signal and output the amplified signal to the first BPF, a processor, and a transceiver connected to the processor and the power amplifier circuit. The transceiver may include a first PLL circuit configured to output a first reference signal of a first reference frequency band, a first mixer configured to convert a first baseband signal received from the processor into the first RF signal by using the first reference signal, a detection circuit configured to detect the first RF signal on a path connecting the first mixer and the power amplifier circuit, a second PLL circuit configured to output a second reference signal of a second reference frequency band, a second mixer configured to convert the second RF signal received from the second BPF into a second baseband signal by using the second reference signal, and output the second baseband signal to the processor, a third PLL circuit configured to output a third reference signal of a same frequency band as the first reference frequency band, a third mixer configured to convert the first RF signal received from the detection circuit into the first baseband signal by using the third reference signal, and a filter configured to attenuate power of a frequency band higher than the first baseband in a signal to be transmitted from the third mixer to the processor.

Based on determination that the amount of power or the intensity of a signal received from the filter is less than a reference value, the processor may be configured to determine that a frequency band of the first reference signal outputted from the first PLL circuit is not locked to the first reference frequency band.

According to an embodiment, an electronic device may include an antenna, a duplexer including a first BPF configured to output a first RF signal of a transmission frequency band designated to be used for data transmission to a network through the antenna, and a second BPF configured to output a second RF signal of a reception frequency band designated to be used for data reception from the network through the antenna, a power amplifier circuit configured to amplify the first RF signal and output the amplified signal to the first BPF, a processor, and a transceiver connected to the processor and the power amplifier circuit. The transceiver may be configured to convert a first baseband signal received from the processor into the first RF signal and output the first RF signal to the power amplifier circuit, to convert the second RF signal received from the second BPF into a second baseband signal and output the second baseband signal to the processor, to acquire the first RF signal to be outputted to the power amplifier circuit, to generate, by using the acquired first RF signal, a status signal indicating whether a frequency band of a reference signal used when converting the first baseband signal into the first RF signal is locked to a designated reference frequency band, and to output the status signal to the processor.

While the disclosure has been particularly shown and described with reference to certain embodiments thereof, it will be understood by those skilled in the art that various changes in form and details may be made therein without departing from the scope of the subject matter as defined by the appended claims and their equivalents.

What is claimed is:
1. An electronic device comprising:
an antenna;
a duplexer including a first band pass filter (BPF) configured to output a first radio frequency (RF) signal of a transmission frequency band designated to be used for data transmission to a network through the antenna, and a second BPF configured to output a second RF signal of a reception frequency band designated to be used for data reception from the network through the antenna;

a power amplifier circuit configured to amplify the first RF signal and output the amplified signal to the first BPF;

a processor; and a transceiver connected to the processor and the power amplifier circuit, wherein the transceiver includes:

a first phase locked loop (PLL) circuit configured to output a first reference signal of a first reference frequency band;

a first mixer configured to convert a first baseband signal received from the processor into the first RF signal by using the first reference signal;

a detection circuit configured to detect the first RF signal on a path connecting the first mixer and the power amplifier circuit;

a second PLL circuit configured to output a second reference signal of a second reference frequency band;

a second mixer configured to convert, by using the second reference signal, the second RF signal received from the second BPF into a second baseband signal, and convert the first RF signal received from the detection circuit into a third baseband signal;

a first filter configured to attenuate power of a frequency band higher than the second baseband in a signal to be transmitted from the second mixer to the processor; and a second filter configured to attenuate power of a frequency band lower than the third baseband or attenuate power of the third baseband in a signal to be transmitted from the second mixer to the processor.

2. The electronic device of claim 1, wherein the second filter includes a high pass filter (HPF) configured to attenuate the power of the frequency band lower than the third baseband, and wherein based on determining that a frequency band of a signal received from the second filter is not equal to a first reference value corresponding to the third baseband, the processor is configured to determine that a frequency band of the first reference signal outputted from the first PLL circuit is not locked to the first reference frequency band.

3. The electronic device of claim 1, wherein the second filter includes a notch filter configured to attenuate the power of the third baseband, and wherein, based on determining that intensity of a signal received from the second filter exceeds a second reference value, the processor is further configured to determine that a frequency band of the first reference signal outputted from the first PLL circuit is not locked to the first reference frequency band.

4. The electronic device of claim 3, wherein the notch filter is configured to adjust a frequency band to be attenuated in accordance with a change of a gap between the transmission frequency band and the reception frequency band.

5. The electronic device of claim 1, wherein the transmission frequency band includes an uplink band in a particular band selected from frequency bands designated to be used for a frequency division duplexing (FDD) communication scheme, and wherein the reception frequency band includes a downlink band in the particular frequency band.

6. The electronic device of claim 5, wherein the first reference frequency band and the second reference frequency band are the uplink band and the downlink band, respectively, and wherein the third baseband corresponds to a gap between the uplink band and the downlink band.

7. The electronic device of claim 1, wherein the detection circuit includes:

an RF signal acquisition circuit disposed on a path connecting the first mixer and the power amplifier circuit and configured to acquire the first RF signal; and an RF signal output circuit disposed on a path connecting the second BPF and the second mixer and configured to output the acquired first RF signal to the second mixer.

8. The electronic device of claim 7, wherein the RF signal acquisition circuit includes a coupler, a divider, or a first switch configured to selectively connect the first mixer to the power amplifier circuit or the RF signal output circuit, and wherein the RF signal output circuit includes a combiner, or a second switch configured to selectively connect the second mixer to the RF signal acquisition circuit or the second BPF.

9. The electronic device of claim 7, wherein the detection circuit further includes an adjustment circuit disposed on a path connecting the RF signal acquisition circuit and the RF signal output circuit, and configured to adjust power of the first RF signal, acquired by the RF signal acquisition circuit, to converge to a specified level.

10. The electronic device of claim 1, wherein the second mixer is implemented with a passive mixer, and wherein the transceiver further includes an amplification circuit configured to amplify a voltage of a signal outputted from the second mixer and output the voltage-amplified signal to the first filter and the second filter.

11. An electronic device comprising:

an antenna;

a duplexer including a first band pass filter (BPF) configured to output a first radio frequency (RF) signal of a transmission frequency band designated to be used for data transmission to a network through the antenna, and a second BPF configured to output a second RF signal of a reception frequency band designated to be used for data reception from the network through the antenna;

a power amplifier circuit configured to amplify the first RF signal and output the amplified signal to the first BPF;

a processor; and a transceiver connected to the processor and the power amplifier circuit, wherein the transceiver includes:

a first phase locked loop (PLL) circuit configured to output a first reference signal of a first reference frequency band;

a first mixer configured to convert a first baseband signal received from the processor into the first RF signal by using the first reference signal;

a detection circuit configured to detect the first RF signal on a path connecting the first mixer and the power amplifier circuit;

a second PLL circuit configured to output a second reference signal of a second reference frequency band;

a second mixer configured to convert the second RF signal received from the second BPF into a second baseband signal by using the second reference signal, and output the second baseband signal to the processor;

a third PLL circuit configured to output a third reference signal of a same frequency band as the first reference frequency band;

a third mixer configured to convert the first RF signal received from the detection circuit into the first baseband signal by using the third reference signal; and a filter configured to attenuate power of a frequency band higher than the first baseband in a signal to be transmitted from the third mixer to the processor.

12. The electronic device of claim 11, wherein, based on determining that intensity of a signal received from the filter is less than a reference value, the processor is further configured to determine that a frequency band of the first reference signal outputted from the first PLL circuit is not locked to the first reference frequency band.

13. The electronic device of claim 11, wherein the transmission frequency band includes an uplink band in a particular band selected from frequency bands designated to be used for a frequency division duplexing (FDD) communication scheme, and wherein the reception frequency band includes a downlink band in the particular frequency band.

14. The electronic device of claim 11, wherein the detection circuit includes:

an RF signal acquisition circuit disposed on a path connecting the first mixer and the power amplifier circuit and configured to acquire the first RF signal;

an RF signal output circuit disposed on a path connecting the second BPF and the second mixer and configured to output the acquired first RF signal to the second mixer; and a switch configured to selectively connect the RF signal acquisition circuit to the third mixer or the RF signal output circuit.

15. The electronic device of claim 14, wherein the RF signal acquisition circuit includes a coupler, a divider, or a first switch configured to selectively connect the first mixer to the power amplifier circuit or the RF signal output circuit, and wherein the RF signal output circuit includes a combiner, or a second switch configured to selectively connect the second mixer to the RF signal acquisition circuit or the second BPF.

16. The electronic device of claim 14, wherein the detection circuit further includes an adjustment circuit disposed on a path connecting the RF signal acquisition circuit and the switch, wherein the adjustment circuit is configured to adjust power of the first RF signal, acquired by the RF signal acquisition circuit, to converge to a specified level.

17. An electronic device comprising:

an antenna;

a duplexer including a first band pass filter (BPF) configured to output a first radio frequency (RF) signal of a transmission frequency band designated to be used for data transmission to a network through the antenna, and a second BPF configured to output a second RF signal of a reception frequency band designated to be used for data reception from the network through the antenna;

a power amplifier circuit configured to amplify the first RF signal and output the amplified signal to the first BPF;

a processor; and a transceiving means connected to the processor and the power amplifier circuit, wherein the transceiving means is configured to:

convert a first baseband signal received from the processor into the first RF signal and output the first RF signal to the power amplifier circuit, convert the second RF signal received from the second BPF into a second baseband signal and output the second baseband signal to the processor, acquire the first RF signal to be outputted to the power amplifier circuit, generate, by using the acquired first RF signal, a status signal indicating whether a frequency band of a reference signal used when converting the first baseband signal into the first RF signal is locked to a designated reference frequency band, and output the status signal to the processor.

18. The electronic device of claim 17, wherein, based on determining that a frequency band of the status signal is not equal to a first reference value corresponding to a third baseband indicating a gap between the transmission frequency band and the reception frequency band, the processor is further configured to determine that a frequency band of the reference signal is not locked to the reference frequency band.

19. The electronic device of claim 17, wherein, based on determining that intensity of the status signal exceeds a second reference value, the processor is further configured to determine that a frequency band of the reference signal is not locked to the reference frequency band.

20. The electronic device of claim 17, wherein, based on determining that intensity of the status signal is less than a third reference value, the processor is further configured to determine that a frequency band of the reference signal is not locked to the reference frequency band.

* * * * *